(12) United States Patent
Bissey et al.

(10) Patent No.: US 6,841,438 B2
(45) Date of Patent: Jan. 11, 2005

(54) ANNULAR GATE AND TECHNIQUE FOR FABRICATING AN ANNULAR GATE

(75) Inventors: Lucien J. Bissey, Boise, ID (US); Kevin G. Duesman, Boise, ID (US)

(73) Assignee: Micron Technology, Inc., Boise, ID (US)

(*) Notice: Subject to any disclaimer, the term of this patent is extended or adjusted under 35 U.S.C. 154(b) by 15 days.

(21) Appl. No.: 10/652,944

(22) Filed: Aug. 29, 2003

(65) Prior Publication Data

US 2004/0089893 A1 May 13, 2004

Related U.S. Application Data

(62) Division of application No. 10/230,568, filed on Aug. 29, 2002.

(51) Int. Cl.[7] ............................................... H01L 29/76

(52) U.S. Cl. ..................... 438/212; 438/268; 438/238; 438/239; 438/386; 438/399

(58) Field of Search ................................. 438/212–399

(56) References Cited

U.S. PATENT DOCUMENTS

| | | | |
|---|---|---|---|
| 5,244,824 A | 9/1993 | Sivan | 437/52 |
| 6,157,060 A | * 12/2000 | Kerber | 257/316 |
| 6,309,919 B1 | 10/2001 | Liu et al. | 438/199 |
| 6,316,309 B1 | 11/2001 | Holmes et al. | 438/246 |
| 6,326,275 B1 | 12/2001 | Harrington et al. | 438/386 |
| 6,335,239 B1 | 1/2002 | Agahi et al. | 438/245 |
| 6,399,979 B1 | 6/2002 | Noble et al. | 257/302 |
| 6,486,027 B1 | * 11/2002 | Noble et al. | |

* cited by examiner

*Primary Examiner*—Fetsum Abraham
(74) *Attorney, Agent, or Firm*—Fletcher Yodar (57) ABSTRACT

A memory structure having a vertically oriented access transistor with an annular gate region and a method for fabricating the structure. More specifically, a transistor is fabricated such that the channel of the transistor extends outward with respect to the surface of the substrate. An annular gate is fabricated around the vertical channel such that it partially or completely surrounds the channel. A buried annular bitline may also be implemented. After the vertically oriented transistor is fabricated with the annular gate, a storage device may be fabricated over the transistor to provide a memory cell.

27 Claims, 9 Drawing Sheets

ANNULAR GATE AND TECHNIQUE FOR FABRICATING AN ANNULAR GATE

This application is a Divisional of U.S. application Ser. No. 10/230,568 filed Aug. 29, 2002.

BACKGROUND OF THE INVENTION

1. Field of the Invention

The present invention relates generally to integrated circuits and, more particularly, to integrated circuits implementing vertical transistors having annular gate structures.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Semiconductor memory devices, such as dynamic random access memory (DRAM) devices, are widely used for storing data in systems such as computer systems. A DRAM memory cell typically includes an access device such as a field effect transistor (FET) coupled to a storage device such as a capacitor. The access device allows the transfer of charges to and from the storage capacitor thereby facilitating read and write operations in the memory device. The memory cells are typically arranged in a number of rows and columns to provide a memory array.

With the constantly increasing demand for higher data storage capacity, memory arrays are becoming more dense. Memory density is typically limited by current processing technologies used for fabrication of the memory arrays. One technique for providing higher density memory arrays is to incorporate vertical technology in fabricating the access transistors. Among the concerns in fabricating memory devices is to provide memory cells with minimal leakage to prevent the loss of storage cell data. Further, alpha-particle induced soft errors which alter the data stored in the memory cells should also be considered, and simplification in fabrication techniques may also be desirable.

BRIEF DESCRIPTION OF THE DRAWINGS

Advantages of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
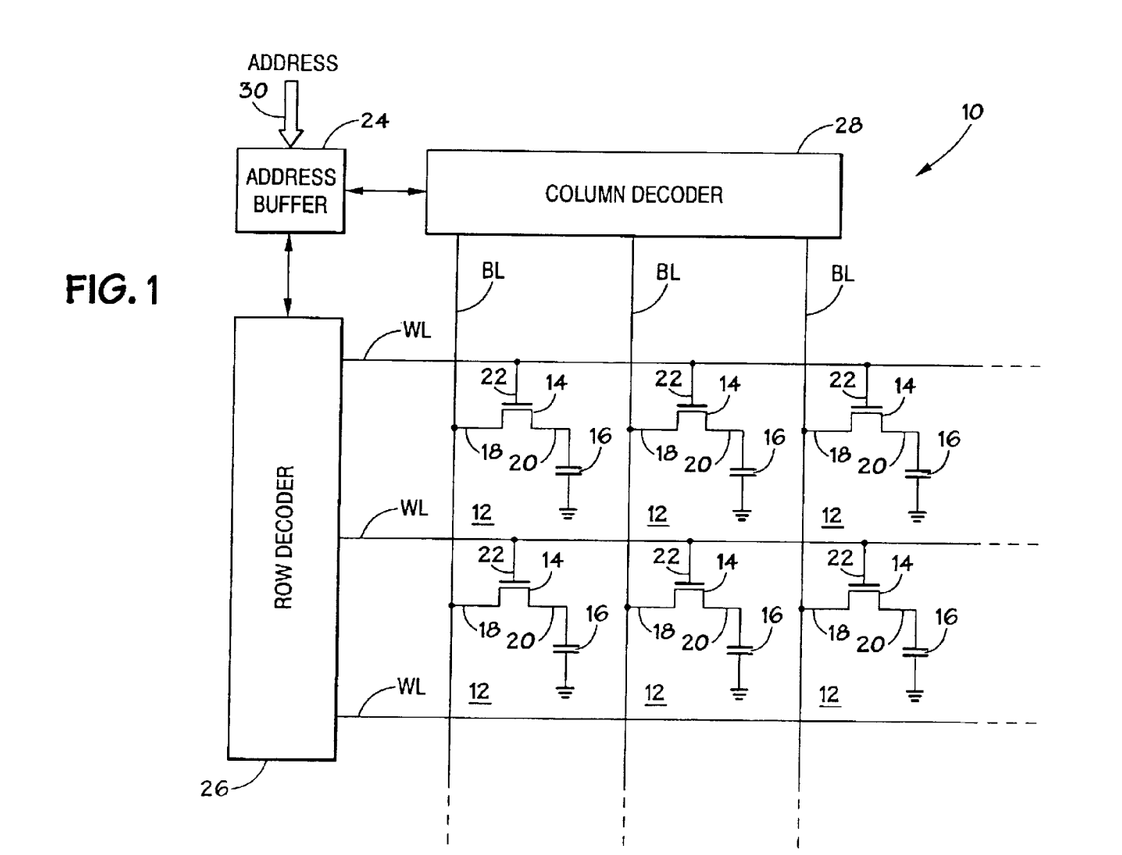
FIG. 1 illustrates a partial exemplary schematic illustration of an integrated circuit incorporating an array of memory cells that may be fabricated in accordance with the techniques described herein.

FIG. 1 is a partial exemplary schematic illustration of an integrated circuit, such as a memory device 10, incorporating an array of memory cells which may be fabricated in accordance with the techniques described herein. The memory device 10 may be, for example, a dynamic random access memory (DRAM) device. In the exemplary embodiment, the memory device 10 includes a number of memory cells 12 arranged in a grid pattern comprising a number of rows and columns. As can be appreciated, the number of memory cells (and corresponding rows and columns) may vary depending on system requirements and fabrication technology.

Each memory cell 12 includes an access device and a storage device as previously discussed. In the present exemplary embodiment, the access device comprises a field-effect transistor (FET) 14 and the storage device comprises a capacitor 16. The access device is implemented to provide controlled access to the storage device. In the exemplary memory cell 12, the FET 14 includes a drain terminal 18 and a source terminal 20, along with a gate terminal 22 for controlling conduction between the drain and source terminals 18, 20. The storage device, such as the capacitor 16, is coupled to one of the source/drain terminals 18, 20. The terminal of the capacitor 16 that is not coupled to the FET 14 may be coupled to a reference plane.

It should be noted that although the above description depicts the terminal of the access device that is coupled to the capacitor 16 as the source 20 and the other non-gate terminal of the access device as the drain 18, during read and write operations, the FET 14 may be operated such that each of the terminals 18 and 20 operates at one time or another as a source or a drain. Accordingly, for purposes of further discussion, it should be recognized that whenever a terminal is identified as a source or a drain, it is only for convenience. During operation of the FET 14 either terminal could be a source or a drain depending on the manner in which the FET 14 is being controlled by the voltages applied to the terminals 18, 20, and 22 of the FET 14.

As previously described, the memory array is arranged in a series of rows and columns. To implement the data storage capabilities in the memory cell 12, an electrical charge is placed on the drain 18 of the FET 14 via a bitline (BL). By controlling the voltage at the gate 22 via the wordline (WL), a voltage potential may be created across the FET 14 such that the electrical charge at the drain 18 can flow to the capacitor 16. As can be appreciated, by storing an electrical charge in the capacitor 16, the charge may be interpreted as a binary data value in the memory cell 12. For instance, for a single-bit storage device, a positive charge above a known threshold voltage may be interpreted as a binary "1." If the charge in the capacitor 16 is below the threshold value, a binary value of "0" is said to be stored in the memory cell 12.

As previously described, the bitlines BL are used to read and write data to and from the memory cells 12. The wordlines WL are used to activate the FET 14 to access a particular row of a memory cell 12. Accordingly, the memory device 10 includes an address buffer 24, row decoder 26, and column decoder 28. As can be appreciated, the address buffer 24 controls each of the row decoder 26 and the column decoder 28. The row decoder 26 and column decoder 28 selectively access the memory cells 12 in response to address signals that are provided on the address bus 30 during read, write, and refresh operations. The address signals are typically provided by an external controller such as a microprocessor or other memory controller. The column decoder 28 may also include sense amplifiers and input/output circuitry to further enable data to be read to and from the memory cell 12 via the bitlines BL.

In one exemplary mode of operation, the memory device 10 receives an address of a particular memory cell 12 at the address buffer 24. The address buffer 24 identifies one of the wordlines WL of the particular memory cell 12 corresponding to the requested address and passes the address to the row decoder 26. The row decoder 26 selectively activates the particular wordline WL to activate the FETs 14 of each memory cell 12 that is connected to the selected wordline WL. The column decoder 28 selects the bitline (or bitlines) BL of the memory cell 12 corresponding to the requested address. For a write operation, data received by input/output circuitry is coupled to the selected bitline (or bitlines) BL and provides for the charge or discharge of the capacitor 16 of the selected memory cell 12 through the FET 14. The charge corresponds to binary data, as previously described. For a read operation, data stored in the selected memory cell 12, represented by the charge stored in the capacitor 16, is coupled to the selected bitline (or bitlines) BL, amplified by the sense amplifier, and a corresponding voltage level is provided to the input/output circuit in the column decoder 28.

As can be appreciated, the memory array described with reference to FIG. 1 of the memory device 10 may be fabricated through a variety of technologies. One particularly advantageous technique for fabricating the memory cells 12 will now be described with reference to FIGS. 2–10. The advantages of the presently described fabrication techniques will become apparent upon reading the following detailed description with reference to FIGS. 2–10. To provide a high density memory device 10, vertical transistor technology wherein the channel of the FET 14 is fabricated perpendicular to the surface of a wafer rather than parallel to the surface, is implemented as further described below. Advantageously, the vertically oriented access FET 14 may occupy less space than other techniques. Further, by incorporating vertically oriented access FETs 14, the memory cells 12 are less susceptible to alpha-radiation.

Figure 2:
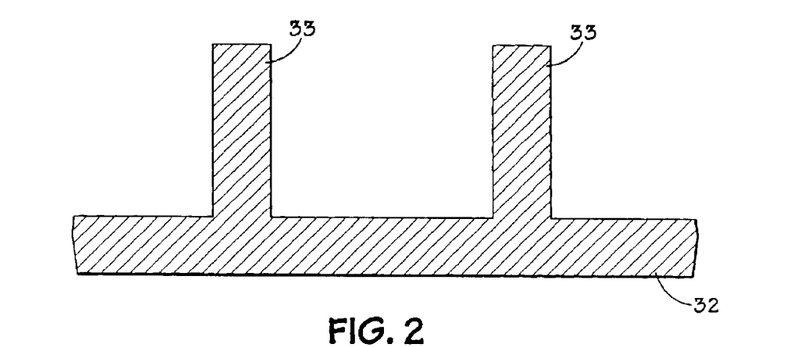
FIGS. 2–9 illustrate a technique for fabricating an access device in a memory cell in accordance with the present invention.

FIG. 2 illustrates a semiconductor substrate material such as silicon (Si). More specifically, the substrate 32 may comprise a P-doped silicon. To fabricate the vertically oriented access FETs 14, the substrate 32 is subtractively etched to produce silicon pillars 33. As described further below, the pillars 33 will eventually form the channels of the FETs 14. The pillars 33 may be formed through any one of a number of commonly known etching techniques, such as plasma etching, ion beam etching, or reactive ion etching (RIE). Each pillar 33 may have a height of approximately 2.0 microns and a diameter of 0.2 microns, for example. In the present embodiment, each pillar 33 may be generally cylindrical such that the top view of each pillar 33 is generally circular. This shape will facilitate the eventual fabrication of annular rings around the pillars 33, as described further below. Alternatively, pillars having other geometric cross-sectional shapes, such as rectangles, squares, or ellipses for example, may be implemented to construct the channel of the FET 14 such that the structure may be surrounded by other layers in the fabrication of the FET 14. As can be appreciated, the specific heights and thicknesses of the features and materials described herein are exemplary in nature and are meant for purposes of illustration only. Accordingly, the exemplary dimensions provided herein are in no way meant to limit the scope of the present techniques. Further, while the present exemplary embodiment illustrates pillars 33 that are perpendicular to the surface of the substrate 32, the pillars 33 may extend away from the surface of the substrate 32 at an angle. For instance, in an alternate embodiment, the pillars 33 may be fabricated at an angle in the range of 45° to 90° with respect to the surface of the substrate 32.

Figure 3:
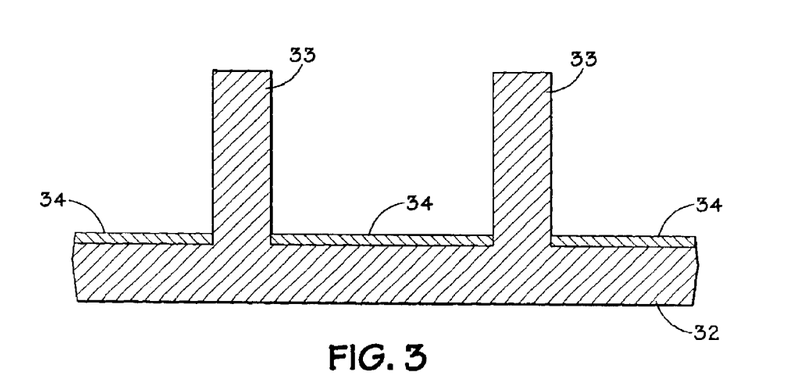

After formation of the pillars 33, an insulation layer such as an oxide layer 34 is applied on top of a substrate 32 as illustrated in FIG. 3. The insulation layer may comprise any number of non-conductive materials such as oxide, silicon dioxide, silicon nitride, etc. The oxide layer 34 is applied by chemical vapor deposition (CVD), for example. The oxide layer 34 may be disposed at a thickness of approximately 0.2 microns, for example. As can be appreciated by those skilled in the art, the oxide layer 34 is disposed over the entire surface of the substrate 32. As can be appreciated, a photo-resist may be used to facilitate the patterning and etching of the oxide layer 34 such that the oxide layer 34 is not present on top of the pillars 33 as illustrated in FIG. 3. It should be understood that those skilled in the art readily understand the deposition, masking, and etching techniques used to construct the patterns illustrated with reference to FIGS. 3–10.

Figure 4:
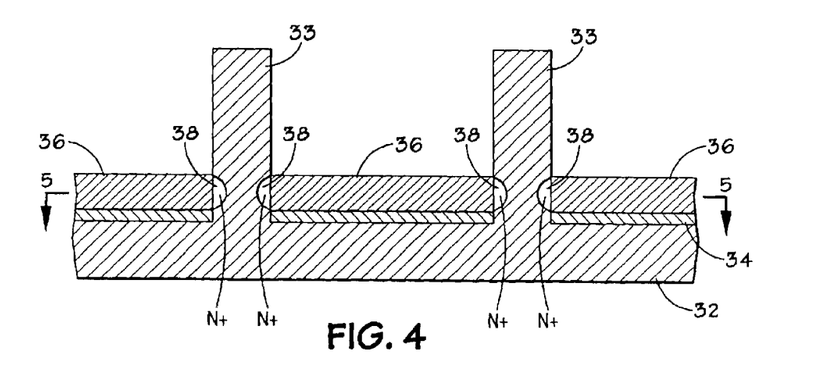

FIG. 4 illustrates the deposition of the material used to create the bitlines BL discussed previously with respect to FIG. 1. A polysilicon layer 36 is disposed on the oxide layer 34. The polysilicon layer 36 may be over-doped such that when the substrate 32 is baked or otherwise heated, the gradient between the polysilicon layer 36 and the substrate 32 will cause dopants to diffuse from the polysilicon layer 36 into the substrate 32 forming n+ contact regions at the silicon/polysilicon interface as illustrated in FIG. 4. As illustrated, the silicon/polysilicon interface is generally near the base of the pillar 33. This process of forming the n+ contact regions 38 is called "out-diffusion." However, as can be appreciated, the contact regions 38 may also be formed using gas diffusion techniques or ion implant techniques. The polysilicon layer 36 may be disposed at a thickness of 0.4 microns, for example.

Figure 5:
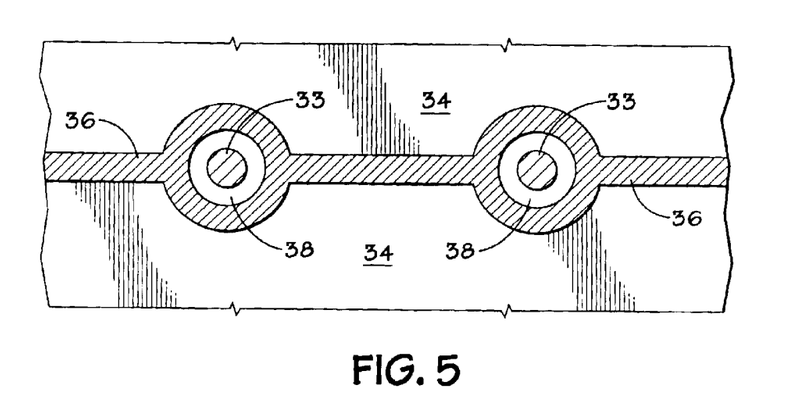

FIG. 5 illustrates a cross-sectional top view of the structure illustrated with reference to FIG. 4 and taken along cut lines 5—5. As can be seen, the polysilicon layer 36 is patterned to provide annular rings around the silicon pillars 33. Thus, the polysilicon layer 36 which forms the bitlines of the memory array described with reference to FIG. 1 extends to connect each of the silicon pillars 33 in a single column. As previously described, the silicon pillar 33 also includes n+ contact regions 38 which may be formed by out diffusion from the polysilicon layer 36. The advantages of the annular ring pattern around the silicon pillars 33 used to form the bitline polysilicon layer 36 will become more apparent through the subsequent discussion herein.

Figure 6:
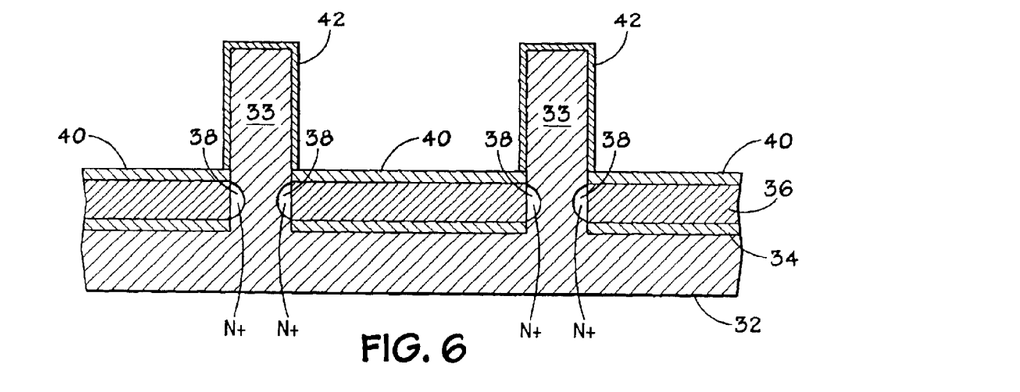

After deposition of the polysilicon layer 36 and the formation of the n+ contact regions 38, another isolation layer, such as an oxide layer 40, is disposed on the polysilicon layer 36 as illustrated in FIG. 6. As can be appreciated, the oxide layer 40 electrically isolates the polysilicon layer 36 from layers subsequently disposed over the oxide layer 40. As with the oxide layer 34, the oxide layer 40 is deposited, patterned and etched to provide a structure as illustrated in FIG. 6. The thickness of the oxide may be 0.2 microns, for example. FIG. 6 further illustrates a thin gate oxide layer 42 which is disposed or grown around the pillar 33 to facilitate the functionality of the gate 22 (FIG. 1) of the FET 14. The gate oxide layer 42 may be grown to a thickness of approximately 60 angstroms by any one of a number of conventional means. It should be noted that for purposes of etch selectivity, the oxide layer 40 and the gate oxide 42 may comprise different insulated materials with respect to one another, such as oxide, silicon dioxide, silicon nitride, TEOS, etc.

Figure 7:
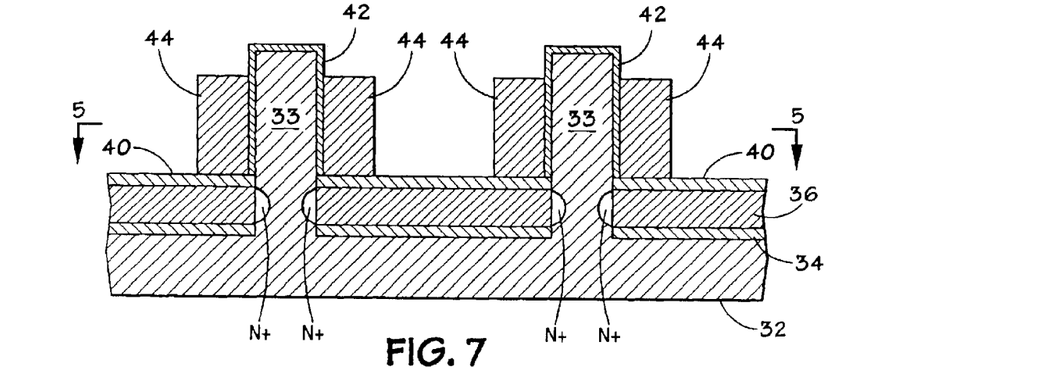
Figure 8:
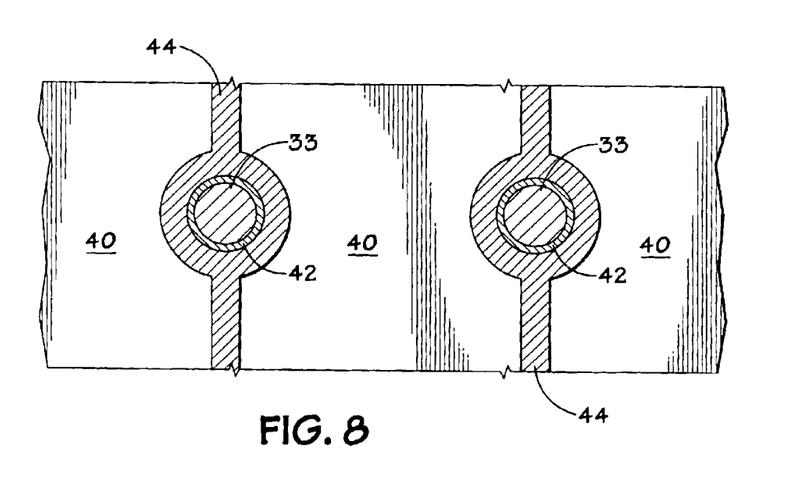

After deposition of the oxide layer 40 and the growth of the gate oxide layer 42, another layer of polysilicon is disposed, patterned, and etched to form the wordline polysilicon layer 44, as illustrated in FIG. 7. The thickness of the wordline polysilicon layer 44 extending upwardly from the surface of the substrate 32 in the direction of the pillar 33 may be about 0.8 microns, for example. The thickness of the wordline polysilicon layer 44 extending outwardly from the surface of the pillar 33 may be about 0.1 to about 0.2 microns, for example. In the cross-section illustrated with reference to FIG. 7, the wordline polysilicon layer 44 appears to provide a gate region on either side of the pillar 33. However, as can be appreciated, the wordline polysilicon layer 44 is patterned such that the polysilicon material completely surrounds the pillar 33, as with the bitline polysilcon layer 36. The wordline polysilicon layer 44 extends in a direction perpendicular to the page. As illustrated in FIG. 8, the wordline polysilicon layer 44 is patterned such that it runs perpendicular to the bitline polysilicon layer 36. FIG. 8 illustrates a cross-sectional top view of the structure illustrated with reference to FIG. 7 and taken along cut lines 8—8. The advantages of the annular ring pattern around the silicon pillars 33 used to form the wordline polysilicon layer 44 will become more apparent through the subsequent discussion herein.

After deposition, patterning, and etching of the wordline polysilicon layer 44, a dielectric layer 46, such as silicon dioxide or silicon nitride, is deposited over the entire structure such that each of the pillars 33 are completely covered, as illustrated with reference to FIG. 9. The dielectric layer 46 may be disposed by chemical vapor deposition (CVD), for example. Thus, the dielectric layer 46 may be deposited at a thickness of more than 1.0 micron, in the present exemplary embodiment, such that the dielectric layer 46 is disposed to a height approximately coplanar with the height of the pillars 33.

After deposition of the dielectric layer 46, the surface of the structure may be planarized such as by chemical-mechanical polishing/planarization (CMP). The surface of the structure is planarized to a point where the thin gate oxide layer 42 is removed from the top of the pillar 33 thereby exposing the silicon pillar 33 below. Finally, an n+ contact region 48 is formed at the top of the pillar 33. The n+ contact region 48 may be formed through gas diffusion or ion implant techniques, for example. The n+ contact region 48 forms the source 20 of the FET 14 which will be coupled to the capacitor 16 formed in subsequent processing steps illustrated with respect to FIG. 10.

Figure 9:
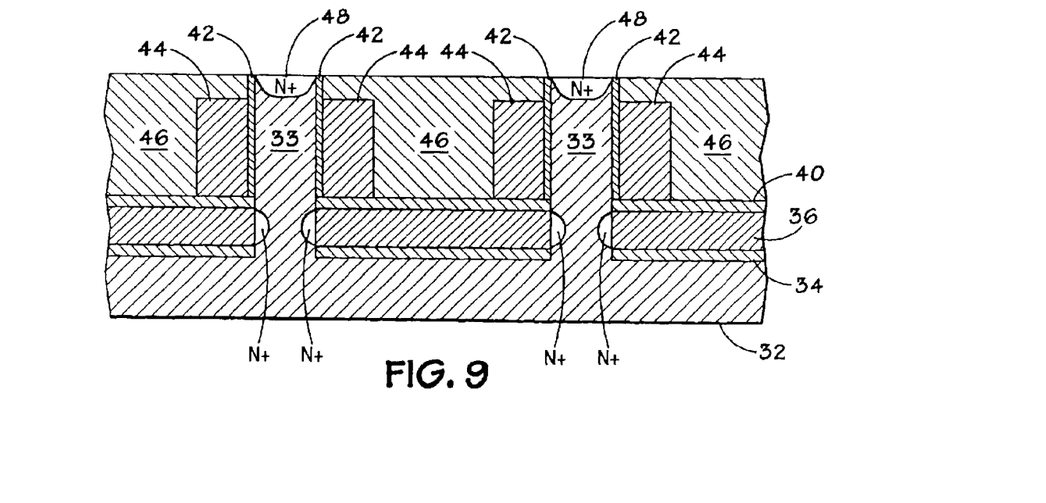

FIG. 9 illustrates the completed fabrication of the access device (FET 14). As can be appreciated, the silicon pillar 33 thus forms a channel of the FET 14. By completely surrounding the channel with the wordline polysilicon layer 44, the gate 22 functions as a channel with increased drive capabilities over access devices having conventional gate structures. Further, the present techniques also provide improved refresh of the memory cell 12 since there are no PN junctions of the capacitor to the substrate, thereby reducing the leakage paths and the frequency of the refresh. Finally, the annular structure of the bitline polysilicon layer 36 may offer further advantages of the present techniques, as well.

Figure 10:
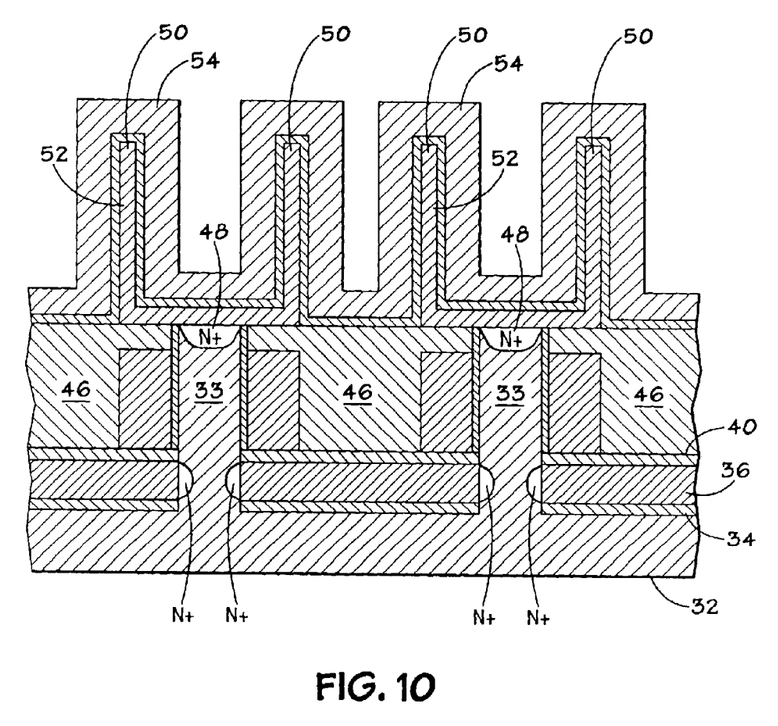
FIG. 10 illustrates a cross-sectional view of the exemplary access device illustrated in FIG. 9 further incorporating an exemplary storage device.

As previously described, to complete the memory cell 12, a storage device, such as a capacitor 16 is fabricated. As can be appreciated by those skilled in the art, any number of capacitor types and fabrication techniques may be used in conjunction with the FET structure described above with reference to FIGS. 2–9. FIG. 10 illustrates a completed memory cell structure 12 incorporating an exemplary storage device. In the exemplary embodiment, a crown-type storage capacitor 16 is fabricated using container technology. However, it should be evident that the type of storage device used and method of fabricating the device may be varied. The present embodiment of the memory cell 12 advantageously eliminates leakage current from the capacitor 16 to the substrate 32 since the capacitor 16 is completely isolated from the substrate except through the source 20. Thus, when the access FET 14 is off, there is no p-n leakage path from the storage device (capacitor 16) to the substrate 32 as with conventional designs.

One technique for fabricating a container cell to be used as the storage capacitor 16 is by disposing a sacrificial oxide layer (not shown) on top of the structure illustrated with reference to FIG. 9. The oxide layer is disposed at a thickness at least as high as what will later be the height or vertical thickness of the storage polysilicon layer 50. For instance, the thickness of the sacrificial oxide may be approximately 2.0 microns. Once the sacrificial oxide is disposed, holes are drilled or etched in the oxide to create wells which are vertical with respect to the surface of the substrate. After the wells are created, the storage polysilicon layer 50 may be disposed in the wells. The storage polysilicon layer 50 is disposed to make contact with the n+ contact region 48 of the pillar 33. This interface provides the connection of the FET 14 to the capacitor 16. Next, the polysilicon layer 50 is etched using masks and photoresist to create the container pattern of the polyslicon layer 50 as illustrated in FIG. 10. After the storage polysilicon layer 50 is disposed and etched, the remainder of the sacrificial oxide layer is removed leaving only the crown-shaped or container-shaped structure of the storage polysilicon layer 50. Next, a dielectric layer 52 may be disposed over the polysilicon layer 50. Finally, a cell plate conductive layer 54 may be disposed on the top surface of the dielectric layer 50 to complete the storage device. The conductive layer 54 may be a polysilicon layer, for example. Alternatively, the conductive layer 54 may be a metal, such as aluminum. As can be appreciated by those skilled in the art, a number of fabrication techniques may be used to implement current container technology to create the storage capacitors 16. Further, storage capacitors 16 may comprise a number of other storage devices fabricated using conventional techniques outside of container technology.

Figure 11:
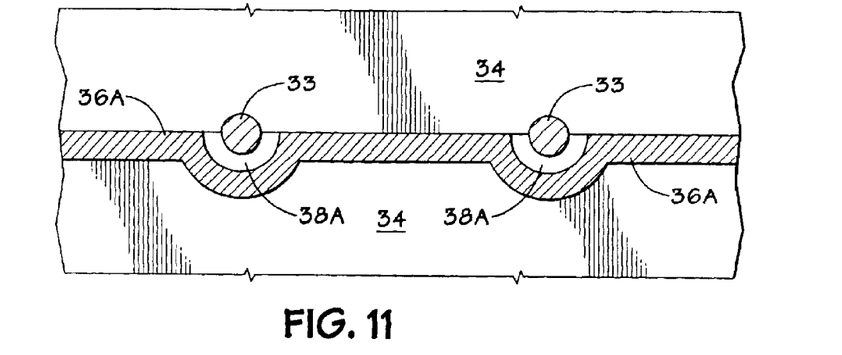
FIG. 11 illustrates a cross-sectional view of an alternate embodiment of a bitline fabricated in accordance with the present techniques.

FIG. 11 illustrates an alternate embodiment of the bitline BL. More specifically, FIG. 11 illustrates a cross-sectional top view of an alternate embodiment of the structure illustrated with reference to FIG. 4 and taken along cut lines 5—5. As can be seen, the polysilicon layer 36A is patterned to provide semi-annular rings around the silicon pillars 33. Thus, the polysilicon layer 36A which forms the bitlines of the memory array described with reference to FIG. 1 extends to connect each of the silicon pillars 33 in a single column. As previously described, the silicon pillar 33 also includes n+ contact regions 38A which may be formed by out diffusion from the polysilicon layer 36A. Thus, the present exemplary embodiment provides a polysilicon layer 36A which is patterned to surround only a portion of the pillar 33. Advantageously, the alternate exemplary embodiment illustrated with reference to FIG. 11 may provide for further pitch reduction and thus, reduction in the area of each memory cell and overall die size.

Figure 12:
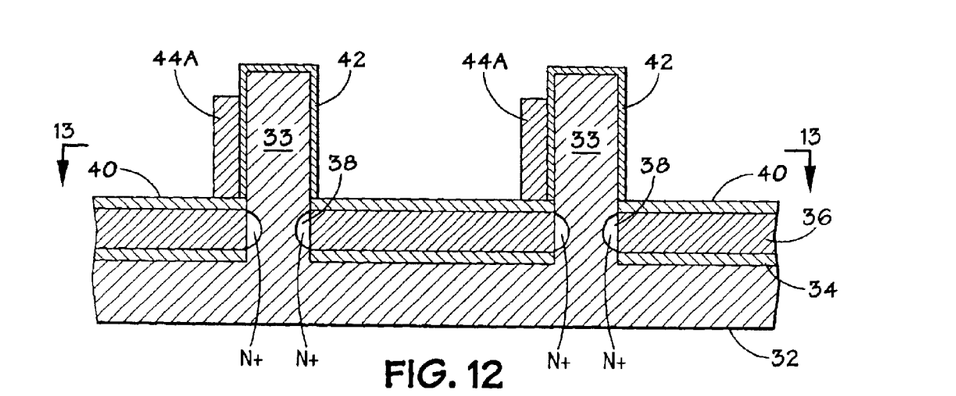
FIGS. 12 and 13 illustrate cross-sectional views of an alternate embodiment of a wordline fabricated in accordance with the present techniques.
Figure 13:
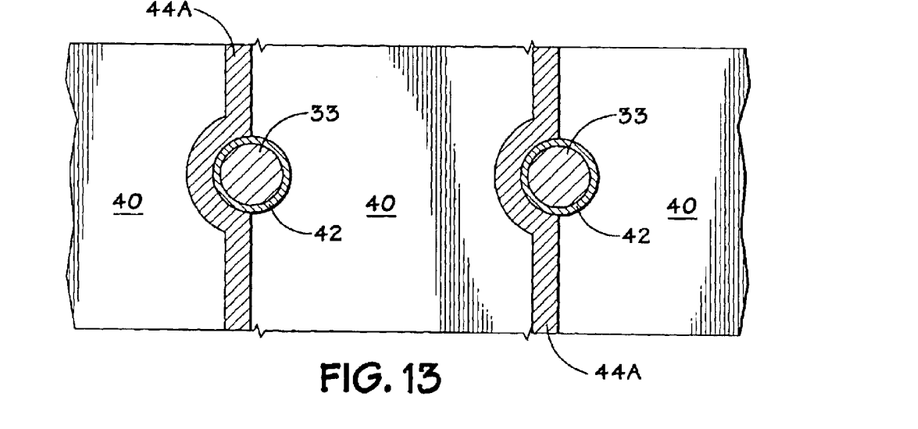

Similarly, the wordline WL, may be patterned to provide a semi-annular ring. FIGS. 12 and 13 illustrate an alternate embodiment of the wordline WL, incorporating semi-annular rings. FIG. 12 illustrates an alternative view of the structure illustrated in FIG. 7. Thus, after deposition of the oxide layer 40 and the growth of the gate oxide layer 42, a polysilicon layer is disposed, patterned and etched to form the polysilicon layer 44A having semi-annular rings. As can be appreciated, the wordline polysilicon layer 44A extends in a direction perpendicular to the page and thus, the view of the structure illustrated in FIG. 12 includes the polysilicon layer 44A on only one side of the pillar 33. However, as can be appreciated, the wordline polysilicon layer 44A is patterned about a portion of the pillar 33, as further illustrated with respect to FIG. 13.

FIG. 13 illustrates a cross-sectional top view of the alternate embodiment illustrated with reference to FIG. 12 and taken along cut lines 13—13. As can be seen, the wordline polysilicon layer 44A is patterned to provide semi-annular rings around the silicon pillars 33. The wordline polysilicon layer 44A is patterned such that it runs perpendicular to the bitline polysilicon layer 36. As can be appreciated, the semi-annular wordline polysilicon layer 44A may be implemented along with the semi-annular bitline polysilicon layer 36A described with reference to FIG. 11. Further, while FIGS. 11–13 illustrate semi-annular rings, it should be evident that an annular ring may extend around any desirable portion (e.g. more than half or less than half) of the pillar 33. For instance, it may be advantageous to provide annular rings that extend around only a quarter to a third of the circumference of the pillar 33. Alternatively, it may be advantageous to provide annular rings that extend around two-thirds to three-quarters of the circumference of the pillar 33, for example.

Figure 14:
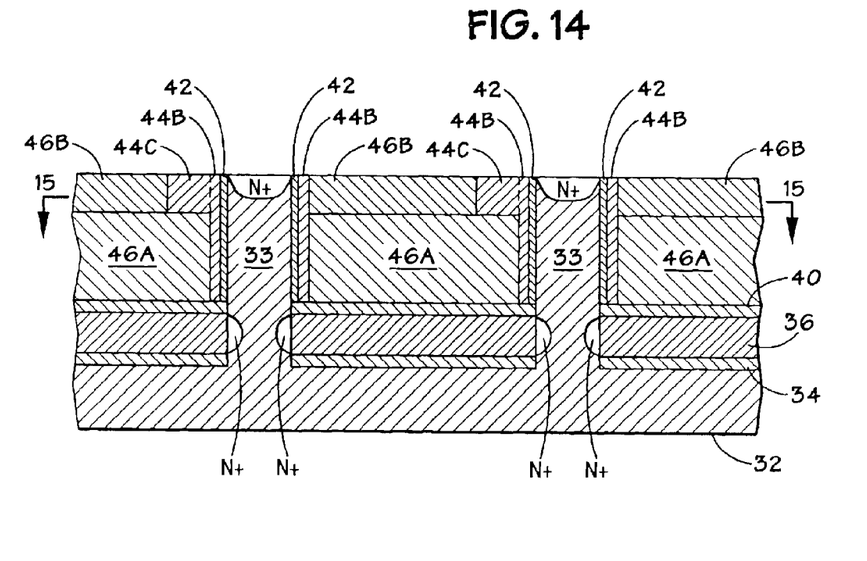
FIGS. 14 and 15 illustrate cross-sectional views of another embodiment of a wordline fabricated in accordance with the present techniques.
Figure 15:
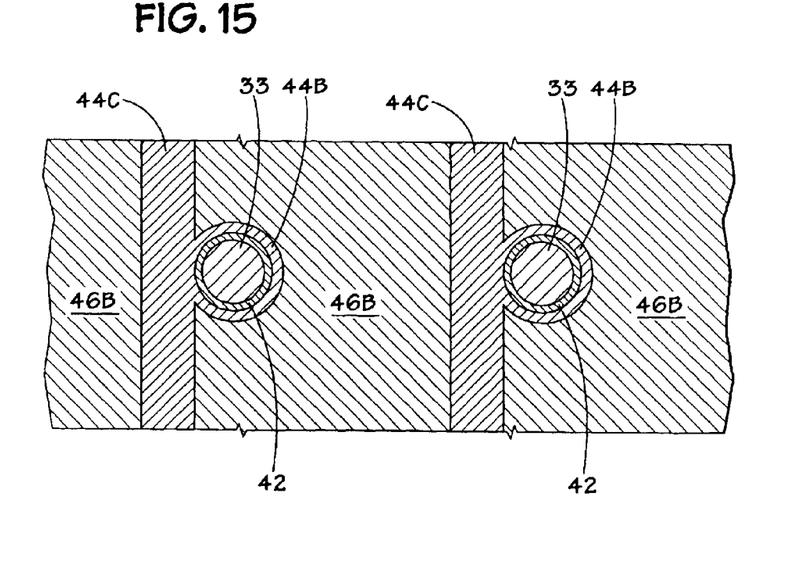

FIG. 14 illustrates an alternate embodiment of the structure illustrated in FIG. 9, implementing an alternate technique of fabricating the wordline WL. FIG. 15 illustrates a cross-sectional top view of the alternate embodiment illustrated in FIG. 14 and taken along the cut lines 15—15. In the present exemplary embodiment, the wordline polysilicon layer 44 is replaced with a thin gate conductor layer 44B and a thick signal conductor layer 44C. As can be seen, the thin gate conductor layer 44B completely surrounds the pillar 33. The thin gate conductor layer 44B may have a thickness extending from the surface of the pillar 33 of less than 0.1 microns, for example. After deposition, patterning and etching of the thin conductor layer 44B, a dielectric layer 46A may be disposed. Unlike the embodiment illustrated in FIG. 9, however, the dielectric layer 46A is not disposed to cover the entire pillar 33. The dielectric layer 46A is disposed such that a portion of the pillar remains uncovered, as illustrated in FIG. 14.

Next, the thick signal conductor layer 44C is disposed, patterned and etched to form the wordline WL. The gate conductor layer 44B is electrically coupled to the signal conductor layer 44C. In one exemplary embodiment, the gate conductor layer 44B and the signal conductor layer 44C are each polysilicon layers. However, as can be appreciated, the gate conductor layer 44B and the signal conductor layer 44C may be different materials. For instance, the gate conductor layer 44B may be a polysilicon layer, while the signal conductor layer 44C may be a tungsten layer. To complete the structure, a dielectric layer 46B may be disposed to a thickness sufficient to cover the pillars 33, and the suface of the structure may be planarized, as previously described. Advantageously, by providing a thin gate conductor layer 44B coupled to a thick signal conductor layer 44C, a smaller pitch between structures may be implemented, thereby reducing cell size and overall die size.

As can be appreciated, while the present wordline and bitline structures are described as being fabricated through deposition techniques, other processes, such as a damascene process may implemented to form the wordlines and bitlines in accordance with the present techniques. Further, while the present exemplary embodiments have illustrated the annular gate structures with respect to DRAM memory devices, the present techniques may be implemented in a number of other applications, such as flash memory cells, SRAM memory cells, anti-fuse devices, image sensors and simple logic gates, for example.

Figure 16:
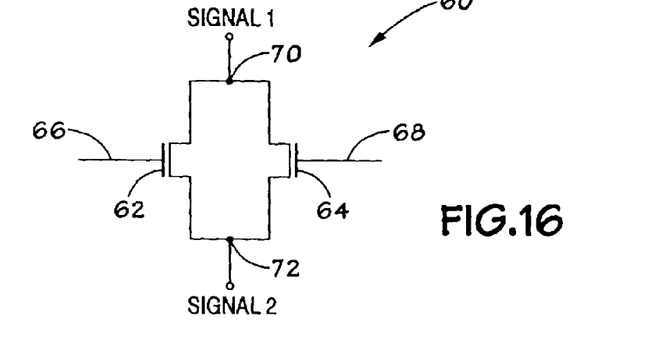
FIGS. 16–18 illustrate an exemplary gate structure fabricated in accordance with the present techniques.
Figure 17:
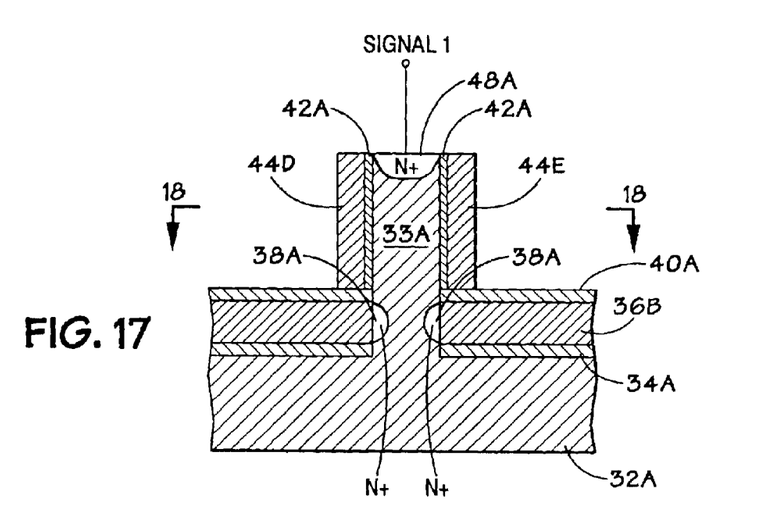

FIG. 16 illustrates a schematic diagram of simple logical gate structure 60 that may be fabricated in accordance with the present techniques. FIG. 17 illustrates an exemplary structure that may be implemented to fabricate the logical gate structure 60 illustrated in FIG. 16. The gate structure 60 of FIG. 16 includes a first transistor 62 coupled in parallel with a second transistor 64. Each transistor 62 and 64 has a respective gate terminal 66 and 68. The source terminals of each transistor 62 and 64 are coupled to each other at a common node 70 such that they may be tied to a common reference SIGNAL1. The drain terminals of each transistor 62 and 64 are coupled to each other at a common node 72, such that they can be tied to a common reference SIGNAL2.

FIG. 17 illustrates the fabrication of the gate structure 60, in accordance with the techniques previously described above. The deposition techniques, exemplary materials and deposition thicknesses described above may be used to supplement the description of the present exemplary embodiment. For clarity, like reference numerals have been used to illustrate layers previously described. Accordingly, the gate structure 60 includes a substrate 32A, such as a p-doped silicon, having a silicon pillar 33A. An insulation layer, such as an oxide layer 34A, is disposed over the substrate 32A. A conductive layer, such as a polysilicon layer 36B, is disposed over the oxide layer 34A. The polysilicon layer 36B may be patterned to form annular rings around the pillar 33A or partial annular rings, such as semi-annular rings, as previously described. Because the present exemplary structure is not a DRAM cell, the polysilicon layer 36B does not form a bitline for the gate structure 60. However, the polysilicon layer 36B serves a similar function in that it provides a signal path. Accordingly, the polysilicon layer 36B may be implemented to provide the common reference SIGNAL2 that is coupled to the common node 72 of the gate structure 60, illustrated in FIG. 16. A second insulation layer, such as an oxide layer 40A is disposed over the polysilicon layer 36A. Further, n+ contact regions 38A are formed near the base of the pillar 33A. The top of the pillar 33A may include a contact region 48A which may be electrically coupled to a SIGNAL1 at the common node 70 of the gate structure 60.

Figure 18:
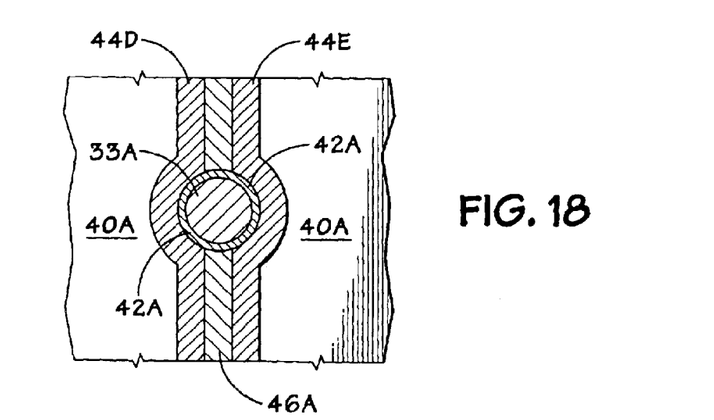

A gate oxide layer 42A may be disposed or grown about the pillar 33A. Because the gate structure 60 includes two gates 66 and 68, two isolated conductive layers such as polysilicon layers 44D and 44E are disposed. The polysilicon layers 44D and 44E are electrically isolated with respect to each other and form the gates 66 and 68 of the gate structure 60. As with the polysilicon wordline 44, the polysilicon layers 44D and 44E extend in a direction perpendicular to the page. Each polysilicon layer 44D and 44E may be patterned to form a partial annular ring about the pillar 33A. To provide electrical isolation of the polysilicon layers 44D and 44E, each of the partial annular rings may extend around approximately one-third of the circumference of the pillar 33A, for example. FIG. 18 illustrates a cross-sectional top view of the structure illustrated with reference to FIG. 17 and taken along cut lines 18—18 after deposition of the dielectric layer 46A. Alternately, the polysilicon layers 44D and 44E may be electrically isolated by disposing the polysilicon layers 44D and 44E in different planes along the length of the pillar 33A, as can be appreciated by those skilled in the art.

Figure 19:
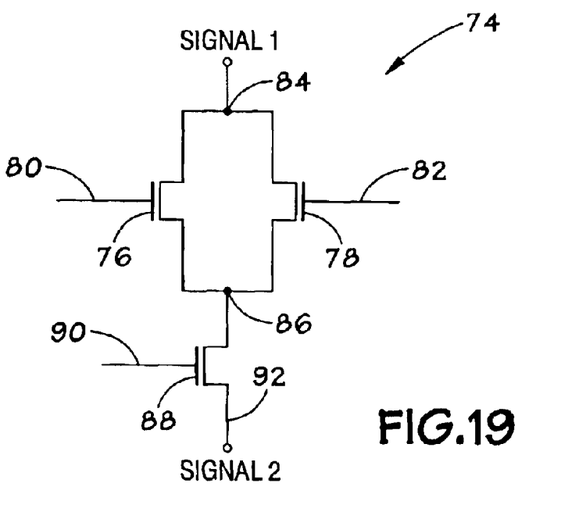
FIGS. 19 and 20 illustrate an alternate exemplary gate structure fabricated in accordance with the present techniques.
Figure 20:
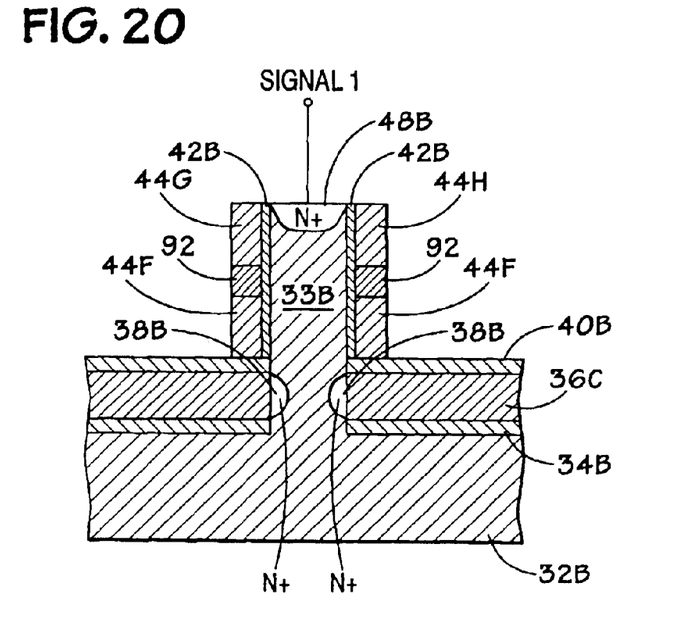

FIG. 19 illustrates a schematic diagram of another logical gate structure 74 that may be fabricated in accordance with the present techniques. FIG. 20 illustrates an exemplary structure that may be implemented to fabricate the logical gate structure 74 illustrated in FIG. 19. The gate structure 74 of FIG. 20 includes a first transistor 76 coupled in parallel with a second transistor 78. Each transistor 76 and 78 has a respective gate terminal 80 and 82. The source terminals of each transistor 76 and 78 are coupled to each other at a common node 84 such that they may be tied to a common reference SIGNAL1. The drain terminals of each transistor 76 and 78 are coupled to each other at a common node 86. The common node 86 is coupled to the source terminal of a third transistor 88. The third transistor 88 has a respective gate terminal 90. The drain terminal 92 of the third transistor 88 is coupled to a common reference SIGNAL2.

FIG. 20 illustrates the fabrication of the gate structure 74, in accordance with the techniques previously described above. The gate structure 74 includes a substrate 32B, such as a p-doped silicon, having a silicon pillar 33B. An insulation layer, such as an oxide layer 34B, is disposed over the substrate 32B. A conductive layer, such as a polysilicon layer 36C, is disposed over the oxide layer 34B. The polysilicon layer 36C may be patterned to form annular rings around the pillar 33B or partial annular rings, such as semi-annular rings, as previously described. The polysilicon layer 36C may be implemented to provide the common reference SIGNAL2 to the drain terminal of the third transistor 88 of the gate structure 74, illustrated in FIG. 19. A second insulation layer, such as an oxide layer 40B is disposed over the polysilicon layer 36C. Further, n+ contact regions 38B are formed near the base of the pillar 33B. The top of the pillar 33B may include a contact region 48B that may be electrically coupled to a reference SIGNAL1 at the common node 84 of the gate structure 74.

A gate oxide layer 42B may be disposed or grown about the pillar 33B. A polysilicon layer 44F is disposed to form the gate 90 of the transistor 88. The polysilicon layer 44F extends in a direction perpendicular to the page and may be patterned to form an annular ring completely about the pillar 33B or about a portion of the pillar 33B, as previously described. Next, an insulating material such as an oxide layer 94 may be disposed to isolate the gate 90 of the transistor 88 from the gates 80 and 82 of transistors 76 and 78 (FIG. 19).

Next, two isolated polysilicon layers 44G and 44H are disposed to form the gates 80 and 82 of the transistors 76 and 78. The polysilicon layers 44G and 44H are electrically isolated with respect to each other and form the gates 76 and 78 of the gate structure 74. As with the polysilicon layers 44D and 44E illustrated with reference to FIGS. 17 and 18, the polysilicon layers 44G and 44H extend in a direction perpendicular to the page and are patterned to form partial annular rings about the pillar 33B. To provide electrical isolation of the polysilicon layers 44G and 44H, each of the partial annular rings may extend around approximately one-third of the circumference of the pillar 33B, for example.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of fabricating an integrated circuit comprising the acts of:
   forming a plurality of pillars in a substrate material, the pillars extending from the surface of the substrate and forming an array of rows and columns, wherein the rows and columns are parallel to the surface of the substrate and perpendicular with respect to each other;
   disposing a first insulative layer over the surface of the substrate material between each of the pillars;
   disposing a first layer of conductive material over the first insulative layer;
   forming a first doped region in each of the plurality of pillars; and
   etching the first layer of conductive material such that a ring is formed around at least a portion of each of the pillars and wherein each of the rings in a column is electrically coupled to the adjacent rings in the column via the conductive material.

2. The method of fabricating an integrated circuit, as set forth in claim 1, wherein the act of forming the plurality of pillars comprises the act of etching a plurality of pillars in the substrate material.

3. The method of fabricating an integrated circuit, as set forth in claim 1, wherein the act of forming the plurality of pillars comprises the act of forming a plurality of pillars in silicon.

4. The method of fabricating an integrated circuit, as set forth in claim 3, wherein the act of forming the plurality of pillars in silicon comprises the act of forming a plurality of pillars in a heavily doped silicon.

5. The method of fabricating an integrated circuit, as set forth in claim 1, wherein the act of forming a plurality of pillars comprises the act of forming a plurality of vertical pillars extending perpendicular to the surface of the wafer.

6. The method of fabricating an integrated circuit, as set forth in claim 1, wherein the act of forming the first doped region comprises the act of forming the first doped region by out-diffusion from the first layer of conductive material to the substrate material.

7. The method of fabricating an integrated circuit, as set forth in claim 1, wherein the act of forming the first doped region comprises the act of forming the first doped region by ion implantation.

8. The method of fabricating an integrated circuit, as set forth in claim 1, wherein the act of disposing a first insulative layer comprises the act of disposing a layer of oxide.

9. The method of fabricating an integrated circuit, as set forth in claim 1, wherein the act of disposing a first layer of conductive material comprises the act of disposing a layer of polysilicon.

10. The method of fabricating an integrated circuit, as set forth in claim 1, wherein the act of etching the first layer of conductive material comprises the act of forming a wordline in a memory array.

11. The method of fabricating an integrated circuit, as set forth in claim 1, wherein the act of etching the first layer of conductive material comprises the act of forming a continuous annular ring about each of the pillars.

12. The method of fabricating an integrated circuit, as set forth in claim 1, wherein the act of etching the first layer of conductive material comprises the act of forming a semi-annular ring about each of the pillars.

13. The method of fabricating an integrated circuit, as set forth in claim 1, wherein the act of etching the first layer of conductive material comprises the act of forming a bitline in a memory array.

14. The method of fabricating an integrated circuit, as set forth in claim 13, comprising the act of disposing a second insulative layer over the first layer of conductive material.

15. The method of fabricating an integrated circuit, as set forth in claim 14, comprising the act of forming a gate oxide layer around each of the pillars such that the pillars are completely coated with the gate oxide layer from a point coincident with the second insulative layer to the end of the pillar furthest from the surface of the substrate.

16. The method of fabricating an integrated circuit, as set forth in claim 15, comprising the act of disposing a second layer of conductive material over the second insulative layer.

17. The method of fabricating an integrated circuit, as set forth in claim 16, comprising the act of etching the second layer of conductive material such that a second ring is formed around at least a portion of each of the pillars and wherein each of the rings in a row of the array is electrically coupled to the adjacent rings in the row by the conductive material.

18. The method of fabricating an integrated circuit, as set forth in claim 17, wherein the act of etching the second layer of conductive material comprises the act of forming a continuous annular ring about each of the pillars.

19. The method of fabricating an integrated circuit, as set forth in claim 17, wherein the act of etching the second layer of conductive material comprises the act of forming a semi-annular ring about each of the pillars.

20. The method of fabricating an integrated circuit, as set forth in claim 17, wherein the act of etching the second layer of conductive material comprises the act of forming a wordline in a memory array.

21. The method of fabricating an integrated circuit, as set forth in claim 20, comprising the act of disposing a third insulative layer on each of the second insulative layer and second layer of conductive material, wherein the third insulative layer is disposed to a thickness at least as high as each of the pillars.

22. The method of fabricating an integrated circuit, as set forth in claim 21, comprising the act of planarizing the third insulative layer such that the top surface of each pillar is exposed.

23. The method of fabricating an integrated circuit, as set forth in claim 22, comprising the act of forming a second doped region in each of the plurality of pillars.

24. The method of fabricating an integrated circuit, as set forth in claim 23, wherein the act of forming the second doped region comprises the act of forming the second doped region by ion implantation.

25. The method of fabricating an integrated circuit, as set forth in claim 24, comprising the act of forming a storage device on the surface of the third insulative layer such that the storage device is electrically coupled to the second doped region.

26. The method of fabricating an integrated circuit, as set forth in claim 25, wherein the act of forming a storage device comprises the act of fabricating a crown type storage capacitor.

27. The method of fabricating an integrated circuit device, as set forth in claim 1, wherein the acts are performed in the recited order.

* * * * *